United States Patent [19]

Shankoff

[11] 4,332,881
[45] Jun. 1, 1982

[54] RESIST ADHESION IN INTEGRATED CIRCUIT PROCESSING

[75] Inventor: Theodore A. Shankoff, Mendham, N.J.

[73] Assignee: Bell Telephone Laboratories, Incorporated, Murray Hill, N.J.

[21] Appl. No.: 172,836

[22] Filed: Jul. 28, 1980

[51] Int. Cl.³ .............................................. G03C 5/00
[52] U.S. Cl. .................................. 430/311; 430/313; 430/506; 156/661.1
[58] Field of Search ............... 430/166, 167, 309, 310, 430/311, 312, 313, 502, 506; 156/661.1

[56] References Cited

U.S. PATENT DOCUMENTS

| | | | |
|---|---|---|---|
| 3,201,239 | 8/1965 | Neugebauer et al. | 430/311 X |
| 3,520,683 | 7/1970 | Kerwin | 430/314 |
| 3,637,384 | 1/1972 | Deutsch et al. | 430/313 X |
| 3,716,390 | 2/1973 | Garbarini | 156/661 |
| 3,737,314 | 6/1973 | Ruleff et al. | 156/661.1 X |
| 3,982,943 | 9/1976 | Feng et al. | 430/312 |
| 4,130,424 | 12/1978 | Feit et al. | 430/315 X |
| 4,202,914 | 5/1980 | Havas et al. | 430/313 X |
| 4,217,407 | 8/1980 | Watanabe et al. | 430/166 |

OTHER PUBLICATIONS

Kaplan et al., "Two and Three Layer Photoresist Technique", IBM Tech. Discl. Bull., vol. 15, No. 7, Dec. 1972, pp. 2339–2340.
Dolgov et al., "Multilayered Thick Photoresist Mask for High Energy Ion Implants", IBM Tech. Discl. Bull., vol. 15, No. 8, Jan. 1973, p. 2570.
Chin et al., "Substrate Protective Coating", IBM Tech. Discl. Bull., vol. 19, No. 9, Feb. 1977, p. 3401.

Primary Examiner—Roland E. Martin, Jr.
Attorney, Agent, or Firm—Lucian C. Canepa

[57] ABSTRACT

The problem of reliably adhering resists to underlying surfaces made of, for example, phosphorus-doped silicon dioxide or silicon nitride is a particularly difficult one. In practice, the use of standard adhesion promoters such as HMDS provides only marginal relief. By baking a relatively thin layer of resist on the underlying layer, a tenacious bond between the thin layer and the underlying surface is achieved. Subsequently, a relatively thick layer of resist is applied and patterned in a standard way. An excellent bond between the thick and thin resist layers results. Subsequent processing of the patterned thick layer leaves the two noted bonded interfaces virtually intact.

1 Claim, 4 Drawing Figures

RESIST ADHESION IN INTEGRATED CIRCUIT PROCESSING

BACKGROUND OF THE INVENTION

This invention relates to a technique for forming fine-line patterns on a substrate and, more specifically, to a method for improving resist adhesion during a processing sequence in which large-scale-integrated (LSI) circuits are fabricated on a semiconductor wafer.

As is well known, resist layers capable of being patterned in a high-resolution way are widely utilized to fabricate LSI circuits on a semiconductor wafer. Initially, patterns are defined in a resist layer adhered to an underlying substrate by irradiating selected portions of the layer with light, electrons, ions or X-rays. The irradiated portions are then removed (positive resist) or not removed (negative resist) from the underlying substrate in a developing step. Subsequently, the uncovered portions of the substrate are processed, for example etched, in a standard pattern transfer step.

In practice, the adherence between edge portions of the resist and the substrate is often weakened or destroyed during the developing step or during the aforenoted subsequent processing step. In turn, this frequently leads to lifting or actual removal of these portions. The edge acuity of the resist pattern is thereby deleteriously affected. In many cases of practical interest, particularly as feature sizes in LSI circuits become increasingly smaller, this loss in edge acuity leads to a significant reduction in the yield of acceptable chips from a wafer.

The problem of achieving good adhesion between a resist layer and an underlying substrate is a general one. But the problem of reliably adhering phenol-formaldehyde positive photoresists to underlying surfaces made of, for example, phosphorus-doped silicon dioxide or silicon nitride is a particularly vexing one. For such surfaces, the use of a very thin (1-to-2 Angstrom) layer of a surface modifier such as hexa-methyl disilizane (HMDS) as an adhesion promoter for positive photoresists has been tried. But, in practice, it has been observed that HMDS often only marginally improves the adhesion of such photoresists to such surfaces.

Accordingly, continuing efforts have been made by workers in the LSI circuit art directed at trying to improve the adhesion achieved between resists and underlying surfaces. It was recognized that such efforts, if successful, could significantly improve the yield and thereby lower the cost of LSI circuits.

SUMMARY OF THE INVENTION

Hence, an object of the present invention is an improved technique for forming fine-line patterns on a substrate. More specifically, an object of this invention is a method for improving resist adhesion to a substrate during a fabrication sequence for making LSI circuits.

Briefly, these and other objects of the present invention are realized in a specific illustrative process in which the adhesion of a standard normal-thickness resist layer to a substrate is enhanced by initially applying a relatively thin layer of resist material to the surface of the substrate. The thin layer is baked on the substrate. A highly tenacious bond between the thin layer and the underlying surface is thereby achieved. Subsequently, the considerably thicker standard resist layer is applied to the thin layer. An excellent bond between the resist layers results. Subsequent patterning and processing of the thick layer, and removal of the portions of the thin layer underlying removed portions of the thick layer, leave the two noted bonded interfaces virtually intact in those portions of the thin-thick resist composite that remain on the substrate.

In one particularly advantageous embodiment of applicant's invention, the relatively thick layer comprises a phenol-formaldehyde positive photoresist and the relatively thin layer thereunder comprises a thinned version of the photoresist.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
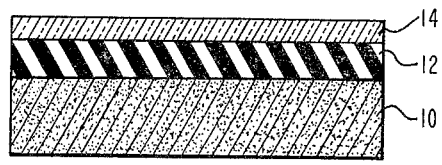
FIGS. 1 through 4 respectively depict (not to scale) portions of an integrated circuit device at various successive stages of a specific illustrative fabrication sequence carried out in accordance with the principles of the present invention.

FIG. 1 is a schematic representation of a partially fabricated microminiature device made in accordance with the teachings of this invention. The device comprises a substrate 10 having a layer 12 to which a standard resist layer to be patterned is to be applied. Illustratively, the substrate 10 is assumed herein to be made of silicon and the device to be fabricated is assumed to be an LSI circuit. Achieving reliable adhesion between an overlying resist layer and the top surface of the layer 12 of such a circuit is almost always in practice a troublesome problem. The problem is found to be a particularly vexing one if the layer 12 is made of a material such as phosphorus-doped silicon dioxide (so-called p-glass) or silicon nitride. Herein, by way of a particular example, the layer 12 is assumed to be a p-glass layer approximately 0.8 micrometers ($\mu$m) thick.

In accordance with the principles of applicant's invention, a normal-thickness layer of a standard resist material is not applied directly on the top surface of the layer 12. Instead, a relatively thin intermediate layer 14 (FIG. 1) is first applied thereto. The minimum thickness of the layer 14 is selected to be greater than the thickness at which discontinuities in the layer 14 approach the minimum feature size defined in the device being fabricated. Moreover, the maximum thickness of the layer 14 is advantageously selected to be less than the thickness which entails an excessively long and difficult removal step during subsequent processing of the device structure. In practice, these requirements are typically met by making the layer 14 approximately 0.0075-to-0.05 $\mu$m thick. Such a layer 14 is considerably thinner (by at least approximately an order of magnitude) than the normal-thickness resist layer to be applied on top of the layer 14. Significantly, the layer 14 is sufficiently thin that the adhesive bonds formed between the layers 12 and 14 have little competition from stresses established within the layer 14. As a result, the layer 14 bonds itself to the surface of the underlying layer 12 in a highly adherent fashion.

In accordance with one specific illustrative example of applicant's invention, the layer 14 of FIG. 1 is formed by spin coating on the layer 12 a sample of the standard resist that is subsequently added to the device for pattern delineation purposes. Thus, for instance, assume that the standard resist is HPR-204 (a commercial positive photoresist manufactured by Philip A. Hunt Chemical Corp., Palisades Park, N.J.). In that case, a sample of HPR-204 itself is advantageously thinned to provide the material from which to form the layer 14. By way of example, one part by volume of the standard HPR-204 resist suspension is thinned by adding thereto 10-to-50 parts by volume of standard HPR-204 thinner.

Other positive photoresists suitable for use in the herein-considered fabrication sequence include Shipley AZ-1350J (manufactured by Shipley Company, Incorporated, Newton, Mass.) and GAF PR-102 (manufactured by GAF Corporation, Binghamton, N.Y.). Counterparts of the aforespecified Shipley and Hunt formulations are described in U.S. Pat. No. 3,201,239, and a counterpart of the aforespecified GAS formulation is described in U.S. Pat. No. 3,637,384.

Numerous other positive photoresists are known and suitable for use in forming the layer 14 shown in FIG. 1. In particular, applicant has determined that the unique fabrication sequence specified herein is especially suited to enhancing the adhesion of standard normal-thickness layers of phenol-formaldehyde positive photoresists to an underlying surface by interposing therebetween a thin coating such as the layer 14.

Standard so-called phenol-formaldehyde positive photoresists actually comprise a phenol-formaldehyde polymer resin component and a photoactive diazide component. In accordance with the principles of the present invention, the relatively thin layer 14 can be formed from a sample of such a two-component material. And, advantageously, such a sample is thinned with additional resist solvent before application to the layer 12. But, alternatively, it is feasible, in accordance with applicant's inventive principles, to utilize a thinned sample of only the phenol-formaldehyde polymer, without the diazide component, to form the layer 14. Such one- or two-component versions of the standard normal-thickness resist layer itself are effective to enhance adhesion of the resist layer. Moreover, homologs or polymers related to the phenol-formaldehyde component may be substituted therefor to form the layer 14.

In accordance with applicant's invention, the relatively thin layer 14 (FIG. 1) is baked after being coated on the top surface of the layer 12. Illustratively, baking is carried out for approximately 60 minutes at a temperature in the range 140-to-300 degrees C. As a result of the baking step, adhesion between the layers 12 and 14 is enhanced. In practice, a tenacious bond therebetween results. Moreover, the material of the layer 14 is substantially entirely cross-linked during baking. Consequently, the layer 14 does not dissolve in and is not deleteriously affected by the solvent portion of the subsequently applied standard resist formulation.

Figure 2:
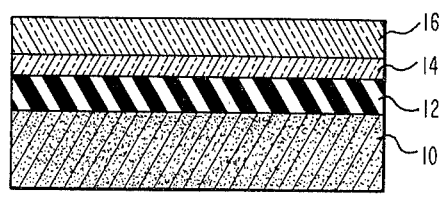

As shown in FIG. 2, a standard resist layer 16 is formed on top of the relatively thin layer 14. By way of example, the relatively thick layer 16 is typically spin coated on the layer 14 to a thickness of approximately 0.4-to-2 $\mu$m. An excellent bond is thereby formed between the substantially identical or similar layers 14 and 16.

Next, specified regions of the resist layer 16 are irradiated to define a pattern therein, in accordance with conventional lithographic techniques known in the art. Then, for a positive resist, the irradiated regions of the layer 16 are removed in a standard developing step. (For a negative resist, the irradiated regions remain in place during development.)

Figure 3:
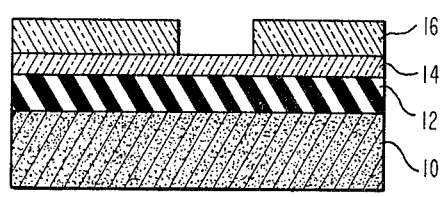
Figure 4:
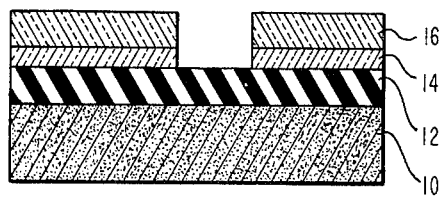

During the developing step, the portions of the layer 14 that underlie the aforespecified removed regions of the layer 16 typically remain in place if the initial thickness of the layer 14 exceeded about 0.01 $\mu$m. This case is schematically represented in FIG. 3. These underlying portions of the layer 14 are subsequently removed in, for example, a standard oxygen plasma etching step. The structure thereby produced is shown in FIG. 4. On the other hand, if the initial thickness of the layer 14 is less than about 0.01 $\mu$m, the specified underlying portions thereof are typically removed during the developing step itself. In that case, a separate etching step is not needed to produce the structure shown in FIG. 4. As indicated in FIG. 4, a prescribed region of the layer 12 has been uncovered and thereby made accessible for subsequent processing such as etching.

As described, above, the patterned structure shown in FIG. 4 can be produced directly as a result of the aforedescribed developing step or it can be produced subsequent to a later etching step that removes prescribed portions of the layer 14. In either case, the edge portions of the opening formed in the layers 14 and 16 are characterized by excellent adhesion. In practice, the bond between the layers 12 and 14 and the bond between the layers 14 and 16 at the edges of the noted opening are unaffected during developing and subsequent processing. Even when, for example, the uncovered region of the layer 12 (FIG. 4) is subjected to an etching step utilizing buffered hydrofluoric acid, the specified bonds remain intact. As a consequence, the edge acuity of features defined in a fabrication sequence carried out in accordance with the principles of the present invention is not deleteriously affected by resist adhesion failures.

Finally, it is to be understood that the above-described techniques are only illustrative of the principles of the present invention. In accordance with these principles, numerous modifications and alternatives may be devised by those skilled in the art without departing from the spirit and scope of the invention. For example, although particular attention herein has been directed to improving the adhesion of positive photoresists of the phenol-formaldehyde type, it is to be understood that the principles of the present invention also apply to other positive photoresists, to negative photoresists and to other resists utilized in electron-beam, X-ray and ion-beam lithography. One such other material (a negative resist formulation) is described in U.S. Pat. No. 4,130,424. For each such other standard normal-thickness resist, the use of a relatively thin resist layer applied as described above is an effective adhesive intermediary between the standard resist layer and an underlying surface.

What is claimed is:
1. A method for improving positive photoresist adhesion during an integrated circuit fabrication sequence that comprises the steps of
   applying resist material to an underlying layer included in an integrated circuit structure,
   establishing a prescribed pattern in said resist material to serve as a mask for processing said underlying layer,
   and processing said underlying layer through said mask in accordance with said fabrication sequence to define in said layer a pattern corresponding to the pattern established in said resist material.

thereby to define a feature of said integrated circuit in said underlying layer, wherein the improvement in said method resides in said applying step, which applying step comprises depositing a relatively thin 0.0075-to-0.05 μm-thick layer of a solvent thinned phenol-formaldehyde polymer positive photoresist on an underlying layer to which a relatively thick layer of a phenol-formaldehyde-based photoresist does not adhere well if applied directly thereto, heating said relatively thin layer for about 60 minutes in the temperature range 140-to-300 degrees C. to enhance the bond between said relatively thin layer and said underlying layer and to cross-link the polymer in said relatively thin layer, and depositing a relatively thick 0.4-to-2 μm-thick layer of a phenol-formaldehyde-based positive photoresist on said relatively thin layer.

* * * * *